United States Patent [19]

Sankaranarayanan et al.

[11] Patent Number: 5,471,419

[45] Date of Patent: Nov. 28, 1995

[54] SEMICONDUCTOR DEVICE HAVING A PROGRAMMABLE MEMORY CELL

[75] Inventors: Lakshmi N. Sankaranarayanan; Jan W. Slotboom; Arjen G. Van Der Sijde, all of Eindhoven, Netherlands

[73] Assignee: U.S. Philips Corporation, New York, N.Y.

[21] Appl. No.: 231,860

[22] Filed: Apr. 22, 1994

Related U.S. Application Data

[63] Continuation of Ser. No. 989,624, Dec. 14, 1992, abandoned.

[30] Foreign Application Priority Data

Dec. 16, 1991 [EP] European Pat. Off. ............ 91203306

[51] Int. Cl.$^6$ .................................................... G11C 11/40
[52] U.S. Cl. ...................... 365/177; 365/182; 257/133; 257/374; 257/378; 257/379; 257/386; 257/399; 257/585
[58] Field of Search ......................... 365/177, 182; 257/374, 378, 379, 386, 399, 585, 586, 133, 137, 164

[56] References Cited

U.S. PATENT DOCUMENTS

| | | | |
|---|---|---|---|
| 3,401,319 | 9/1968 | Watkins | 317/235 |
| 3,731,164 | 5/1973 | Cheney | 365/177 |
| 3,893,085 | 7/1975 | Hansen | 365/177 |
| 4,090,254 | 5/1978 | Ho et al. | 365/177 |
| 4,199,774 | 4/1980 | Plummer | 257/137 |
| 4,435,790 | 3/1984 | Tickle et al. | 365/218 |
| 4,821,235 | 4/1989 | Heald | 257/378 |
| 5,038,191 | 8/1991 | Hasegawa et al. | 365/177 |
| 5,060,194 | 10/1991 | Sakui et al. | 365/177 |
| 5,202,750 | 4/1993 | Gough | 257/133 |

FOREIGN PATENT DOCUMENTS

| | | | |
|---|---|---|---|
| 393863 | 10/1990 | European Pat. Off. | 365/177 |
| 3-203095 | 9/1991 | Japan | 365/177 |

OTHER PUBLICATIONS

I. Ho et al., "High Speed, High Density, Bipolar Random–Access Memory." IBM Tech. Discl. Bull., vol. 21 #4, Jun. 1978, pp. 195–197.

Technical Digest of International Devices Metting 1988, pp. 44–47 K. Sakui et al., "A New Static Memory Cell Based on Reverse Base Current (RBC) Effect on Bipolar Transistor".

*Primary Examiner*—Joseph E. Clawson, Jr.
*Attorney, Agent, or Firm*—Steven R. Biren

[57] ABSTRACT

A semiconductor device having a programmable memory cell which includes a bipolar transistor of which a base region (13) can be provided with a base current through a control transistor (7, 8, 9, 10). The bipolar transistor has an emitter region (12) connected to a first supply line (151) and has a collector region (14) connected to a second supply line (152) through a load (16). A constant potential difference is maintained between the two supply lines (151, 152) during operation. The collector region (14) is laterally electrically insulated and provides a feedback to the control transistor in such a manner that, during operation within a certain voltage domain, a change in the voltage difference between the emitter region (12) and the collector region (14) leads to an opposite change in the conductivity through the control transistor.

1 Claim, 2 Drawing Sheets

SEMICONDUCTOR DEVICE HAVING A PROGRAMMABLE MEMORY CELL

This is a continuation of application Ser. No. 989,624, filed Dec. 14, 1992 abandoned.

BACKGROUND OF THE INVENTION

The invention relates to a semiconductor device comprising a semiconductor body with a programmable memory cell which comprises a bipolar transistor with an emitter region and a collector region of a first conductivity type mutually separated by a base region of a second, opposite conductivity type, the emitter region being coupled to a first supply line and the collector region to a second supply line: while the base region is connected through a control transistor in order to provide the bipolar transistor with a controllable base current at least temporarily during operation.

Such a device is known from the Technical Digest of the International Devices Meeting 1988, pp. 44–47. The known memory cell comprises a vertical bipolar transistor with an n-type emitter and collector region and a p-type base region, the base region being supplied through a PMOS transistor. In the known device, both the emitter region and the collector region is shared with other memory cells, and the cells are operated at a constant potential difference of approximately 6 V between the emitter and the collector regions. The PMOS transistor is connected to a combined write/read line from which a base current can be supplied to the bipolar transistor.

The known memory cell is based on the principle that electrons injected into the base region are capable of detaching electrons in the depletion zone around the base-collector junction, thus creating new free charge carriers. The charge carriers thus generated are subsequently pulled away to both sides of the depletion zone under the influence of the prevailing electric field and thereby provide an additional base current opposite to the base current supplied externally through the PMOS transistor.

If the base-emitter voltage ($V_{BE}$) is sufficiently high, the additional base current gets the upper hand and the bipolar transistor continues to pass current, even if the external base current should disappear. The base-emitter voltage then remains approximately 1 V. If on the other hand only a comparatively low emitter-base voltage is applied, the externally supplied base current remains the greater and the bipolar transistor will be switched off the moment the connection with the base region is broken. The base-emitter voltage in that case is approximately 0 V. By applying a suitable potential to the base region through the PMOS transistor, it is possible to program the known cell in either of two states, corresponding to a logic "1" or "0".

The known device has the disadvantage that the memory cell consumes a comparatively high power during operation. Programmed for a logic "1", the bipolar transistor of the known memory cell carries a current of approximately 0.1 mA, which implies a power consumption of 0.6 mW per memory cell at an emitter-collector voltage of 6 V. As a result, the known device cannot be used in larger memories with, for example, one million memory cells which would require a total power of approximately 600 W on the basis of the known cell.

SUMMARY OF THE INVENTION

The invention has for its object inter alia to provide a device of the kind mentioned in the opening paragraph with a memory cell which has a considerably lower power consumption than the known memory cell.

According to the invention, a device of the kind mentioned in the opening paragraph is for this purpose characterized in that the collector region is laterally electrically insulated, in that the collector region is connected to the second supply line through a load, and in that the collector region provides a feedback to the control transistor so that during operation within a given voltage domain a change in the potential difference between the emitter region and the collector region leads to an opposite change in the conductance through the control transistor.

Since the insulated collector region is connected to the second supply line not directly, but through a load, its potential during operation is dependent on the value of the collector current. The collector current initially rises with an increasing potential difference between the emitter region and the collector region. According to the invention, however, the collector region provides such a feedback that the increasing emitter-collector voltage leads to a decrease in the conductance through the control transistor which supplies the base current for the bipolar transistor. As a result, the base current and thus the collector current decrease. Mutatis mutandis, the feedback leads to an increase in the collector current when the emitter-collector voltage decreases. The change in the collector current as a function of the emitter-collector voltage as a result has a negative derivative within a certain voltage domain.

Connected in series with the load, the transistor has no stable state within this voltage domain. Outside this domain, however, there are found to be states in which the transistor can stabilize. The transistor can be programmed in one of these states, corresponding to a logic "1" or "0", by means of the control transistor. The cell remains in this state also if subsequently the control transistor is no longer externally controlled, but controlled only by the collector region. The state in which the cell finds itself then corresponds to a specific emitter-collector voltage and a specific collector current, and can be read in that one of these quantities is determined.

According to the invention, a memory cell having an emitter surface of 250 µm$^2$ can be operated at a supply voltage of approximately 2.5 V and a collector current of no more than approximately 1.5 nA. The collector current is even lower in proportion as the cell according to the invention is designed to be smaller. With a scale based on a design rule of 1 µm and an emitter surface of 1 µm$^2$, the cell according to the invention takes up a collector current of barely 25 pA, which is approximately a ten million times lower power consumption than that of the known memory cell. Especially where power consumption is a main concern, such as, for example, in many battery-supplied applications, and especially in electronic credit cards (smart cards), the device according to the invention can therefore be used with great profit.

The device according to the invention, however, need not necessarily be operated at such a low current level. The device according to the invention also functions with a collector current which is higher by several orders of magnitude. It is true that power consumption is greater with a greater collector current, but this is counterbalanced by the fact that the access time of the memory cell can be considerably shorter. Both aspects can be utilized in a further embodiment of the device which is characterized in that the bipolar transistor is connected in series with a switchable load and in that the load is provided with switching means for switching the load between a comparatively high and a comparatively low value. The variable load in that case is switched to a high level as long as the information contents of the cell need only be stored. The collector current, and thus the power consumption of the cell, are low in that case. The moment the memory cell is addressed for being programmed or read, however, the load is switched to a comparatively low level, so that a high access speed is obtained.

The switchable load may be formed, for example, by a first resistor of the desired high value, for example of the order of a few G$\Omega$, which is connected in parallel to a transistor in series with a second resistor of the desired low value. When the transistor is switched to the conducting state in that case, the load is switched back from the high value of the first resistor to practically the low value of the second resistor.

In a particular embodiment, the control transistor comprises a field effect transistor having a source and a drain of the second conductivity type which are mutually separated by a controllable channel region to which the collector region has a feedback line. In such a transistor, the conduction between the source and the drain takes place through a channel, which may or may not be induced into the channel region, of the second conductivity type. Owing to the feedback, the conduction in the channel in the device according to the invention is controlled at least partly by the collector potential.

In the case of a field effect transistor with an insulated gate, the feedback may be simply realized in that the collector region is electrically connected to the channel region. In that case the collector voltage forms the so-called backbias of the field effect transistor by which the conductance in the channel region can be influenced. An increase in the emitter-collector voltage will suppress the current through the field effect transistor, and thus the base current, which in its turn will lead to a reduction in the collector current. The result is that the collector current decreases with an increasing emitter-collector voltage.

The particular embodiment in which the control transistor is formed by a field effect transistor, according to the invention, is preferably so constructed that the channel region and the collector region are together formed by a first semiconductor zone of the first conductivity type and in that either the source zone or the drain zone together with the base region is formed by a second semiconductor zone of the second conductivity type. In that case, the control transistor and the bipolar transistor are integrated with one another and a very high packing density can be realized. This is because space required for wiring between the source/drain and the channel region of the field effect transistor on the one hand and the base region or collector region of the bipolar transistor on the other hand, as well as for separate contacts can then be saved.

If the device comprises in addition to the memory cell a similar further memory cell, the packing density may be further increased in that the emitter regions of the two cells are also combined, as is the case in a preferred embodiment of the device according to the invention. The special embodiment is for this purpose further characterized in that the device comprises a similar further memory cell, in that the two memory cells comprise a collector region adjoining the surface and situated on a buried layer of the second conductivity type, which buried layer forms the base region, in that the buried layer is situated on an emitter region of the first conductivity type common to both cells, and in that the cells are mutually separated by a groove which extends from the surface at least to the emitter region and in which a gate electrode is provided which is common to both cells. The surface required for this device is approximately 8 1$^2$ $\mu$m$^2$ per memory cell, e being the smallest achievable lithographic dimension in micrometers. The device according to the invention in that case requires no more or hardly more space than the known device, while the power consumption is considerably reduced.

BRIEF DESCRIPTION OF THE DRAWING

The invention will now be explained in more detail with reference to the drawing, in which.

Figure 1:
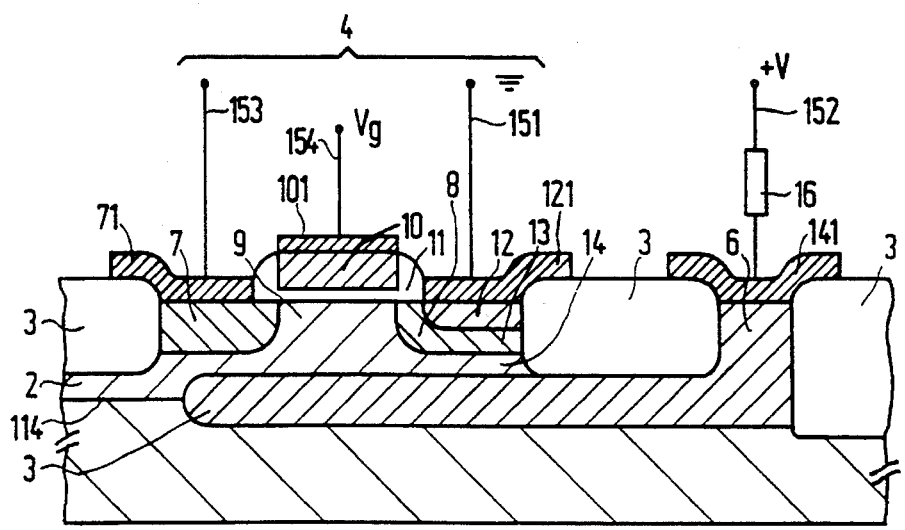
FIG. 1 is a cross-section of a first embodiment of a device according to the invention.

The Figures are purely diagrammatic and not drawn to scale. Some dimensions are particularly strongly exaggerated for greater clarity. Semiconductor regions of the same conductivity type are hatched in the same direction as much as possible, and corresponding parts are given the same reference numerals.

DESCRIPTION OF THE PREFERRED EMBODIMENTS

A first embodiment of the device according to the invention comprises an n-type epitaxial layer 2 provided on a p-type silicon substrate 1, see FIG. 1. A partly recessed field insulation pattern 3 of silicon oxide, laterally bounding an island region 4, is provided in the epitaxial layer. Below the island region 4 there is a comparatively heavily doped n-type buried layer 5. The buried layer 5 lies at an interface between the substrate 1 and the epitaxial layer 2 and provides a low-ohmic connection between the island region 4 and a contact zone 6 adjoining the surface.

The memory cell according to the invention is provided in the island region 4. The memory cell comprises a MOS transistor with a p-type source zone 7 and drain zone 8, separated from one another by a channel zone 9. The source zone 7 is provided with a low-ohmic contact 71 of aluminium at the surface. A gate electrode 10 of n-type silicon is provided over the channel region 9 and insulated from the channel region 9 by a thin gate dielectric 11, in this example an approximately 100 nm thick silicon oxide layer. The conductance in the channel region 9 can be controlled by means of the gate electrode 10. For this purpose, the gate electrode is connected to a diagrammatically indicated control line 154 through an aluminium gate contact 101.

The memory cell further comprises a bipolar transistor, in this example in the form of a vertical NPN transistor which is integrated with the MOS transistor so as to save space. The bipolar transistor comprises an n-type emitter region 12 which is provided in the drain zone 8 of the MOS transistor and is provided with an aluminium emitter contact 121. The drain zone 8 itself forms a p-type base region 13 which separates the emitter region 12 from an n-type collector region 14 which is formed by the island region 4 and is thus integral with the channel region 9 of the MOS transistor. The collector region 14 is laterally insulated by means of the insulation pattern 3. The isolation of the collector region 14 from the p-type substrate 1 is provided by a pn-junction 114 which is blocked during operation.

Figure 2:
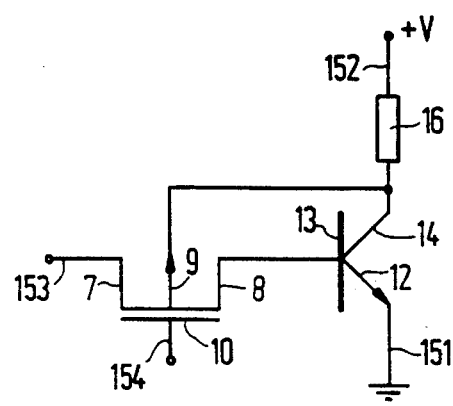
FIG. 2 is an equivalent circuit diagram of the device of FIG. 1.

The emitter region 12 is connected through the emitter contact 121 to a first supply line 151 which is provided with a fixed voltage, in this case ground. The base region 13 can be supplied through the MOS transistor from a third supply line 153 to which the source zone 7 of the MOS transistor is connected. The collector region 14 is coupled to a second supply line 152, which is also kept at an at least substantially constant voltage, through a load 16, in this example an ohmic resistance of approximately 1 G$\Omega$. In the present example, the voltage of the second supply line is approximately 2.5 V. The buried layer 5 and the contact zone 6 in this case ensure the electrical conduction between the collector region 14 and the collector contact 141. An equivalent circuit diagram of the memory cell according to the invention is shown in FIG. 2.

Figure 3:
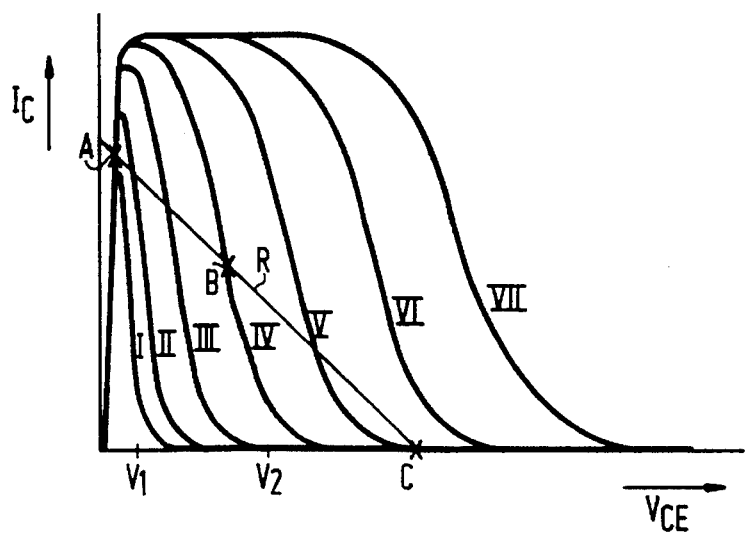
FIG. 3 shows the collector current as a function of the collector voltage for various gate voltages in the device of FIG. 1.

If a sufficient negative control voltage is applied to the gate electrode 10, an inversion channel will be formed below the gate electrode 10 in the channel region 9, so that the MOS transistor becomes conducting. The base region 13 is then supplied with a base current by which the bipolar transistor is also switched on. When the voltage of the collector region 14, and thus of the island region 5 increases, holes are driven from the inversion channel and the conduction through the MOS transistor is gradually pinched off in proportion as the collector voltage rises further. This feedback from the collector region 14 to the MOS transistor eventually has the result that the bipolar transistor receives a lower base current with an increasing emitter-collector voltage, so that the collector current decreases again. In FIG. 3, the curves I–VII diagrammatically show the change in collector current $I_C$ as a function of the emitter-collector voltage $V_{CE}$ for a number of different gate voltages. The curve I here corresponds to a positive gate voltage, and the curve VII to a negative gate voltage, the gate voltage decreasing stepwise in the intermediate curves. Starting from curve IV, the transistor exhibits the negative resistance characteristics described above in the voltage domain from $V_1$ to $V_2$.

The straight line R diagrammatically indicates the current-voltage characteristic of the resistor 16 which is connected in series with the collector region 14. The series circuit of the two elements has the result that there are only three discrete states in which the system can find itself. These states are given by the points of intersection A, B and C of the two characteristics. Of these states, only A and C are stable. State B is unstable; a minute disturbance of state B has the result that the system will immediately switch to one of the stable states A and C. This means that the memory cell will be either in state A or in state B during operation.

Figure 4:
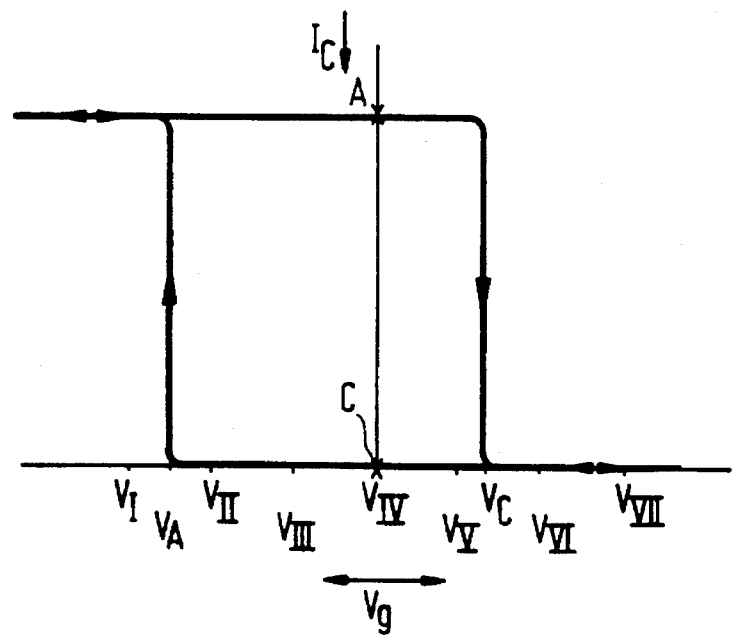
FIG. 4 shows the collector current as a function of the gate voltage in the device of FIG. 1.

The memory cell is programmed in that it is brought into either of the two states. This can be achieved by increasing or decreasing the gate voltage. When the voltage is increased, starting from curve IV which corresponds to a gate voltage of 0 V, the current-voltage characteristic of the cell is shifted in the direction of the curves III–I. For a given gate voltage $V_G$, the characteristic no longer has state A in common with the resistor characteristic R. The cell then has no option but to adopt state C. When on the other hand the gate voltage is decreased, the current-voltage characteristic of the cell shifts in the direction of the curves V–VII. For a given gate voltage $V_A$, state C is no longer shared by the transistor and the resistor in that case, so that the cell is forced to assume state A. When the gate voltage is brought to 0 V again, the cell remains in the programmed state A or C, FIG. 4 shows the collector current Ic as a function of the gate voltage $V_G$. The gate voltages corresponding to the curves I–VII are denoted with $V_I$–$V_{VII}$, respectively.

It will be clear that the cell dissipates the highest power in state A. But even in state A, the power dissipation of the memory cell according to the invention is considerably lower than that of the known memory cell. The memory cell described here supplies a collector current of approximately 1.5 nA in state A, which leads to a power dissipation of approximately 3.75 nW at a supply voltage of 2.5 V. The known memory cell by contrast requires more than one hundred thousand times more power. The power consumption of the memory cell according to the invention may be further reduced through a reduction of the emitter surface area. Given a minimum lithographical dimension of 1 $\mu$m, as in the known device, the cell according to the invention may be constructed with an emitter surface of approximately 1 $\mu m^2$, in which case the cell would consume less than 25 pA, which is more than ten million times lower than in the known device. The device according to the invention, therefore, is eminently suitable for battery powered applications, for example, electronic credit cards and portable electronic units.

The collector region 14 is connected to readout means (not shown) for determining the potential of the collector region 14 relative to the emitter region 12. The state in which the memory cell is stabilized can be read out in this manner. Alternatively, however, any other fixed reference voltage may be chosen instead of the emitter potential relative to which the collector potential is determined. It is also possible to use the collector current instead of the collector voltage as an indication of the instantaneous memory state of the cell.

Figure 5:
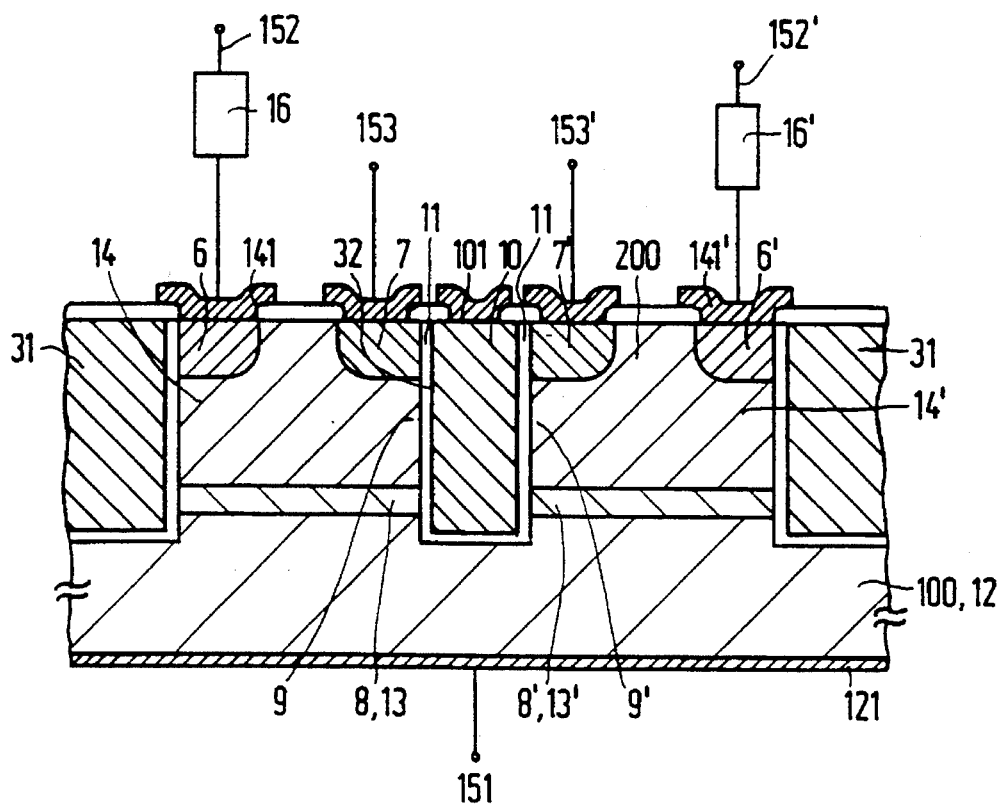
FIG. 5 is a cross-section of a second embodiment of the device according to the invention.

A second embodiment of the device according to the invention is shown in FIG. 5. The device shown comprises an n-type silicon substrate on which an n-type epitaxial layer 200 is provided. The epitaxial layer 200 is divided into islands by means of grooves, in which islands separate memory cells are provided. Two such cells are shown in the Figure. As in the preceding example, the memory cell comprises a bipolar transistor whose base region is controlled by a PMOS transistor.

The bipolar transistor in the present example is formed by an n-type collector region 14, 14' which is situated at the surface and which is separated from the n-type substrate 100 by a buried base region 13, 13'. The base region is formed here by a p-type buried layer which lies at an interface between the substrate 100 and the epitaxial layer 200. The buried layer at the same time forms a buried drain zone 8, 8' of the PMOS control transistor. The substrate 100 forms an emitter region 12, which is common to both cells and is provided with an emitter contact 121 at the lower side. The substrate 100 is connected to a first supply line 151 through the emitter contact 121.

The collector region 14, 14' is formed by an island of the n-type epitaxial layer 200 and is provided with a comparatively heavily doped contact zone 6, 6' at the surface. A collector contact is provided on the contact zone 6, 6' by which contact the collector region 14, 14' according to the invention is coupled to a second supply line 152, 152' through a load 16, 16'.

The n-type island at the same time forms a channel region 9, 9' of the PMOS transistor, separating the buried drain zone 8, 8' from a p-type source zone 7, 7' situated at the surface. The conductivity of the MOS transistor which is vertically integrated in this way can be controlled with a gate electrode 10 which is provided in the groove 32 between the two memory cells. The groove wall is previously provided with a thin insulating layer 11 of silicon oxide by which the gate electrode 10 is insulated from the channel region 9, 9'. In the present example, p-type polycrystalline silicon is used for the gate electrode, which is found to fill up the groove satisfactorily. Such filled grooves 31 provide lateral insulation for the memory cells elsewhere.

A fixed potential difference is applied between the first and the second supply line 151, 152. A cell can then be programmed in that a suitable voltage sweep is offered to the gate electrode 10, as described for the first embodiment. The source zones 7, 7' of the two cells are each connected to their own further supply line 153, 153', from which a base current can be supplied to the base regions 13, 13', respectively. The memory cell to be programmed can be selected by applying a voltage or not to the further supply line 153, 153'.

The operation of the embodiment of the device described here does not differ essentially from that of the first embodiment. The present embodiment of the device, however, is integrated in a more efficient manner. The surface area required for the device in this embodiment is approximately $8\ l^2\ \mu m^2$ per memory cell, l being the smallest achievable lithographic dimension in micrometers. The device in this case requires no more or hardly more space than does the known device, while the power consumption is considerably reduced.

It should be noted that the device according to the invention need not necessarily be operated at an extremely low current level. The device also functions with a collector current which is higher by a few orders of magnitude. It is true that the power consumption is greater when the collector current is greater, but this is counterbalanced by the fact that the access time for the memory cell can be much shorter. If the bipolar transistor is connected in series with a variable load and the load is provided with switching means for switching the load between a comparatively high and a comparatively low value, both aspects can be utilized. The variable load in that case is switched to a high level as long as the information contents of the cell need only be stored. The collector current, and therefore the power consumption of the cell are low in that case. The moment the memory cell is addressed so as to be programmed or read, however, the load is switched to a comparatively low value, so that a greater access speed is obtained. Such a switchable load may be formed, for example, by a first resistor connected in parallel to a second resistor in series with a switching transistor.

Although the invention was explained with reference to two embodiments, it will be obvious that the invention is by no means limited to the examples given. Many more variations are possible within the scope of the invention. Thus the conductivity types specified may all be simultaneously replaced by their opposites. Furthermore, it is possible in principle to use, for example, a JFET or a bipolar transistor as the control transistor instead of an MOS transistor. The collector region may in that case provide a feedback to the gate electrode or the base of the control transistor, respectively.

Furthermore, so-called growing and doping techniques, such as molecular beam epitaxy (MBE) and so-called delta doping may be used for manufacturing the device according to the invention. Especially the second embodiment is advantageously realised by means of MBE, in which case a doped SiGe layer or a layer of another contrasting semiconductor material having a sharply defined hetero-pn-junction is used instead of the buried layer which forms the base of the bipolar transistor, so that the amplification factor of the bipolar transistor reaches a comparatively high value.

In general terms, the invention supplies a semiconductor device provided with a memory cell whose power consumption during operation is comparatively low and with which a high packing density can be realised.

We claim:

1. A semiconductor device comprising a semiconductor body with a programmable memory cell which comprises a single bipolar transistor with an emitter region and a collector region of a first conductivity type mutually separated by a base region of a second, opposite conductivity type, the emitter region being coupled to a first supply line and the collector region being coupled to a second supply line, while the base region is connected through a control transistor to a third supply line in order to provide the bipolar transistor with a controllable base current at least temporarily during operation, wherein the collector region is laterally electrically insulated, the collector region is connected to the second supply line through a load, and the collector region provides feedback to the control transistor such that during operation within a given voltage domain a change in magnitude of the potential difference between the emitter region and the collector region in a first direction causes a change in conductance of the control transistor in a second, opposite direction, which contributes to a change in the magnitude of the base current in said second direction, the control transistor comprises a field effect transistor having a source zone and a drain zone of the second conductivity type which are mutually separated by a controllable channel region, the collector region provides feedback to the channel region of the field effect transistor, the channel region is separated from a gate electrode by a dielectric layer, the collector region is electrically connected to the channel region, the channel region and the collector region are together formed by a first semiconductor zone of the first conductivity type and one of the source zone and the drain zone together with the base region are formed by a second semiconductor zone of the second conductivity type, the device further comprising a similar further memory cell, the memory cell and further memory cell comprising a collector region adjoining the surface and situated on a buried layer of the second conductivity type, which buried layer forms the base region, the buried layer being situated on an emitter region of the first conductivity type common to both cells, the cells being mutually separated by a groove which extends from the surface at least to the emitter region, and the gate electrode being provided in said groove and being common to both cells.

\* \* \* \* \*